(12) United States Patent
Oppelt (10) Patent No.: US 7,761,060 B2
(45) Date of Patent: Jul. 20, 2010

(54) METHOD AND APPARATUS FOR TRANSMISSION OF SIGNALS

(75) Inventor: Ralph Oppelt, Uttenreuth (DE)

(73) Assignee: Siemens Aktiengesellschaft, Munich (DE)

(*) Notice: Subject to any disclaimer, the term of this patent is extended or adjusted under 35 U.S.C. 154(b) by 1128 days.

(21) Appl. No.: 11/250,824

(22) Filed: Oct. 14, 2005

(65) Prior Publication Data
US 2006/0100860 A1 May 11, 2006

(30) Foreign Application Priority Data
Oct. 14, 2004 (DE) .................. 10 2004 050 088

(51) Int. Cl.
*H04B 1/00* (2006.01)
*H04B 7/00* (2006.01)
(52) U.S. Cl. .................. 455/72; 455/39; 455/46; 455/501; 333/14
(58) Field of Classification Search .................. 455/72, 455/39, 42, 46, 501, 73, 75, 91; 333/14
See application file for complete search history.

(56) References Cited

U.S. PATENT DOCUMENTS

| | | | | |
|---|---|---|---|---|
| 4,524,244 A | * | 6/1985 | Faggin et al. | 379/93.09 |
| 4,677,645 A | * | 6/1987 | Kaniwa et al. | 375/222 |
| 5,115,471 A | * | 5/1992 | Liden | 381/106 |
| 6,285,305 B1 | | 9/2001 | Feld et al. | |
| 6,285,798 B1 | * | 9/2001 | Lee | 382/260 |
| 6,552,591 B1 | * | 4/2003 | Abadi et al. | 327/306 |
| 6,714,093 B2 | | 3/2004 | Oppelt et al. | |

FOREIGN PATENT DOCUMENTS

| DE | 20 35 479 C3 | 2/1971 |
|---|---|---|
| DE | 29 31 951 A1 | 2/1981 |

* cited by examiner

*Primary Examiner*—Tuan A Pham
(74) *Attorney, Agent, or Firm*—Schiff Hardin LLP

(57) ABSTRACT

In a method and apparatus for transmission of signals, an input signal is supplied to at least one dynamic compressor and the dynamics of the signal is compressed by the dynamic compressor with a degree of compression. The compressed signal is subsequently adapted, in particular limited, in terms of its frequency bandwidth dependent on the degree of compression, such as directly dependent on the degree of compression or dependent on a reference value directly associated with the degree of compression, such as the input level of the signal before the dynamic compressor.

51 Claims, 5 Drawing Sheets

METHOD AND APPARATUS FOR TRANSMISSION OF SIGNALS

BACKGROUND OF THE INVENTION

1. Field of the Invention

The present invention concerns a method and an apparatus for transmission of signals.

2. Description of the Prior Art

In many applications, electrical as well as optical signals must be transmitted with a high dynamic range, for example in magnetic resonance imaging systems (MR), in particular in medical imaging, for example magnetic resonance tomography. MR signals exhibit a very high dynamic range of approximately 100 dB, but exhibit a relatively small monitoring bandwidth of approximately 500 kHz.

In the transmission link, the analog signals are often converted into digital (generally binary) signals by an analog-digital converter (A/D converter) and then digitally stored and/or processed further, or converted back again into analog signals by a digital-analog converter (D/A converter). An A/D converter circuit suitable for MR is known, for example, from DE 199 14 207 C2.

It is also known (for example from DE 101 48 441 C1) to transmit the analog signals via a wireless transmission link, for example for wireless readout of MR local coils or movable MR coils, by modulation and transmission of the modulated signals and subsequent demodulation of the received signals. The demodulated signals are then digitized by an A/D converter.

In order to be able to limit the digital resolution or the bit-width of the A/D converter, or the bandwidth of the (in particular wireless) transmission link, even for signals with high dynamic range, it is known (for example from DE 101 48 441 C1) to use a dynamic compressor before the A/D converter or the further (in particular wireless) transmission link. The dynamic compressor reduces or compresses the dynamic range of the signals before their digitization or transmission. The original signal is then regained by digital expansion from the stored, digital compressed signals or digital compressed signals, transmitted in another manner, for example using a value table or lookup table.

In order to retain a good signal-to-noise ratio S/N, even for small amplitude signals, generally such signals are still linearly amplified, but are only compressed at a specific level range, for example 60 dB given full modulation (maximum recording level), or above a specific threshold of the signal level. In the digitization it is thereby ensured that the A/D converter is also modulated to a sufficient degree even for small signals. The larger the signal amplitude, the more significantly it is compressed in general, i.e. the greater the degree of compression or compression factor of the dynamic compressor. In other words, the characteristic of the compressor, representing the output signal plotted with respect to the input signal, initially climbs linearly up to a threshold, and beyond the threshold the characteristic is convex or continuously decreases in the positive slope or first derivative. The characteristic above the threshold frequently has the curve of an exponential function with a positive exponent smaller than 1, typically between 0.2 and 0.5. The overall characteristic normally exhibits a point-symmetrical curve (thus two of the characteristic branches just described are mirrored point-for-point at the origin), or is an odd function, in order to achieve the same compression for positive and negative signals.

Such a dynamic compressor is described, for example, in the aforementioned DE 101 48 441 C1 and has a number of amplifier stages connected in series each stage having an output amplification limited to a stage limit level, and a summation stage for summation of the output signals of the amplifier stages and of the input signal to be compressed. The summation signal is then the compressed signal.

SUMMARY OF THE INVENTION

The invention is based on the recognition that, due to the point-symmetry or odd function of the compressor characteristic, the odd-numbered harmonics or frequency components in the frequency spectrum of the compressed signal are stronger the more significantly the signal is compressed or "flattened" or approximates a square wave signal.

The invention is further based on the recognition that, in the transmission of the compressed signal, a sufficient number of uneven harmonics must be detected in order to be able to optimally reconstruct the signal again without errors in the expansion. In particular the analog input part of the A/D converter must exhibit a correspondingly large bandwidth. The bandwidth to be sampled thus cannot be limited by an anti-aliasing filter to the largest frequency that occurs in the linear case, as is typical in the linear case or in linear amplification. Thus, a number of noise sidebands are merged into the baseband of the signal, which leads to a significant S/N degradation relative to the original noise ratio of the purely analog system.

In accordance with the invention the compressed signal is adapted, in particular to limit (in terms of its bandwidth) the compressed signal dependent on its degree of compression or corresponding to its original signal level or its original signal amplitude. The subsequent transmission or digitization thus can be optimized with regard to the noise ratio (S/N) and the transfer or digitization bandwidth. According to the invention, dynamic compression is realized with an adapted bandwidth, or the bandwidth tracks the degree of compression.

According to the invention, a method for transmission of signals includes the steps of feeding a signal to at least one dynamic compressor, compressing the dynamics of the signal in the dynamic compressor according to a degree of compression (compression factor, amplification of the compressor), and limiting the frequency bandwidth of the compressed signal dependent on the degree of compression, i.e. directly dependent on the degree of compression or dependent on a reference value, measurement value, physical value directly associated with the degree of compression, preferably dependent on the input level of the signal before the dynamic compressor.

Also, according to the invention an apparatus for transmission of signals has at least one dynamic compressor for compression of the dynamics of the signal with an associated degree of compression, and at least one bandwidth limiter that limits the frequency bandwidth of the compressed signal dependent on the degree of compression, i.e., directly dependent on the degree of compression or dependent on a reference value directly associated with the degree of compression, preferably dependent on the input level of the signal before the dynamic compressor.

The frequency bandwidth of the compressed signal is adjusted or changed by at least one frequency filter, preferably a frequency filter downstream from the dynamic compressor.

A device is provided for the control, dependent on the degree of compression or the reference value, for each bandwidth limiter or each limitation filter, preferably by means of a control filter.

In an embodiment, the frequency bandwidth of the compressed signal is substantially continuously varied or is varied as a monotonic function over a predetermined range of the degree of compression or the associated value, dependent on the degree of compression or the reference value.

In a further embodiment, the frequency bandwidth of the compressed signal is adjusted or changed dependent on a predetermined or predeterminable limit value of the degree of compression or of the reference value.

Given a larger degree of compression or a reference value corresponding to a larger degree of compression, the frequency bandwidth of the compressed signal or of the frequency filter is higher than for a lower degree of compression or a reference value corresponding to a lower degree of compression. Given a lower degree of compression or a reference value corresponding to a lower degree of compression, the signal-to-noise ratio of the compressed and adapted (in terms of its frequency bandwidth) signal is greater than for a higher degree of compression or a reference value corresponding to a higher degree of compression.

A control signal for each frequency filter is generally derived or generated using the degree of compression or the reference value. In an embodiment, the input level of the signal is determined as a reference value before the dynamic compressor.

In a further embodiment, the device for the control of the or each bandwidth limiter has a level detector for detection of the input level of the input signal of the dynamic compressor or of the uncompressed signal, and that emits at a control output, a control signal dependent on the detected input level. In general, the control output of the level detector or compression degree detector is associated with or can be associated with at least one control input of the frequency filter, for the control of the frequency filter by means of the control signal.

In a further embodiment, a ratio (in particular a logarithmic ratio) of the output level of the signal after the dynamic compressor and the input level of the signal before the dynamic compressor is determined as a reference value. For this purpose, the device for the control of each bandwidth limiter preferably has a compression degree detector for detection of a ratio (in particular a logarithmic ratio) of the output level of the output signal of the dynamic compressor or of the compressed signal, and the input level of the input signal of the dynamic compressor or of the uncompressed signal as a reference value, and that emits at a control output, a control signal dependent on the detected ratio. In the case of a conversion by an electric circuit, the logarithmic ratio can be determined, for example, relatively simply by two analog logarithm detectors and a subtractor following them.

Each frequency filter preferably has at least one filter input, at least one control input and at least one filter output. At least one filter input is connected or can be connected with at least one compressor output of the dynamic compressor at which the compressed signal can be tapped or is available.

The frequency filter preferably contains at least one controllable low-pass filter. The limit frequency of the low-pass filter preferably is controlled or changed dependent on the degree of compression or the reference value.

In another embodiment, the group delay or phase of the compressed signal is essentially constant or is independent of the frequency bandwidth, even for different frequency bandwidths. For this purpose, at least one controllable all-pass or group delay filter preferably is provided, in particular in the frequency filter. The all-pass or group delay filter preferably compensates a change of the group delay of the signal for a given change of the limit frequency of the low-pass filter. The at least one group delay filter or all-pass filter can be upstream, but preferably is downstream, of the at least one low-pass filter.

The controllable frequency filter or group delay filter or all-pass filter preferably has at least one controllable capacitance diode.

In another advantageous embodiment, the control signal and the compressed signal or output signal of the dynamic compressor have essentially the same phase angle or signal delay. This can be achieved by suitable design or adaptation of the circuits of the dynamic compressor and the device for detection of the input level of the dynamic compressor input signal or of the uncompressed signal, in particular a level detector or a compression degree detector.

In a further embodiment, the control signal and the compressed signal or the output signal of the dynamic compressor are significantly phase-shifted. Compensation or equalization of this phase shift or group delay differences is then provided, such that the control signal and the output signal of the dynamic compressor or the input signal of the frequency filter are subsequently essentially in phase again.

The signals to be transmitted and/or the transmitted signals preferably are electromagnetic signals, in particular optical signals. The electromagnetic wavelengths used for optical signal transmission, thus the wavelengths of ultraviolet, visible or infrared light, preferably lie at approximately 200 nm to 1600 nm, the corresponding frequencies at approximately $1500 \cdot 10^{12}$ to $187.5 \cdot 10^{12}$ Hz.

The signals to be transmitted and/or the transmitted signals very preferably can be electrical signals.

In a specialized embodiment, the signals to be transmitted are magnetic resonance signals, in particular signals generated by a magnetic resonance imaging system (for example from a magnetic resonance coil and/or a magnetic resonance tomography apparatus), or signals derived from MR signals.

The frequency bandwidth of the uncompressed signals or of the input signals of the dynamic compressor in particular lies in a range from approximately 0.2 to 1.5 MHz, in particular 0.5 to 1 MHz. For MR signals, for example, the maximal observation bandwidth is approximately 500 kHz.

In the case of MR signals, the (absolute) frequency spectrum of the uncompressed signals is in the range of radio waves, preferably in a frequency range of approximately 10 MHz to 130 MHz. Before it is relayed to the dynamic compressor, this frequency spectrum is preferably down-mixed in an intermediate frequency, for example 1 to 2.5 MHz, in order to keep the bandwidth of the compressed output signals down.

The dynamic range of the uncompressed signals or of the input signals of the dynamic compressor preferably is in a range from 50 dB to 120 dB, in particular at approximately 100 dB, and/or the dynamic range of the compressed signals or output signals of the dynamic compressor is in a range from 50 dB to 100 dB, preferably at approximately 80 dB. The degree of compression of the dynamic compressor is preferably approximately 0 to 50 dB.

In a preferred application, the signals to be transmitted and/or the transmitted signals exhibit a central lobe of maximal signal level and secondary lobes of lower signal level, as is normally the case in MR signals.

The compressed signals preferably are digitized, if applicable after passing through an (in particular wireless) transmission link. For this purpose, for example, the invention includes at least one analog-digital converter (in particular downstream from the bandwidth limiter, preferably the frequency filter(s)) for conversion of the compressed and frequency band-limited signal into digital form.

In a preferred embodiment, the arrangement for keeping the group delay or phase of the compressed and frequency-limited signal constant is a digital group delay equalizer located after the analog-digital converter for conversion of the compressed and frequency band-limited signal into digital form. The control of the group delay equalizer is performed dependent of the degree of compression or the reference value that is preferably converted beforehand into digital form. In an embodiment, the means for the analog-digital converter used for this purpose converts into digital form only the portions of the signal present at its at least one input that have a current level in the range compressed by the dynamic compressor.

In a preferred embodiment, the digitized, compressed signals are digitally re-expanded, if applicable after passing through an (in particular wireless) transmission link and/or after digital buffering.

DESCRIPTION OF THE PREFERRED EMBODIMENTS

Figure 1:
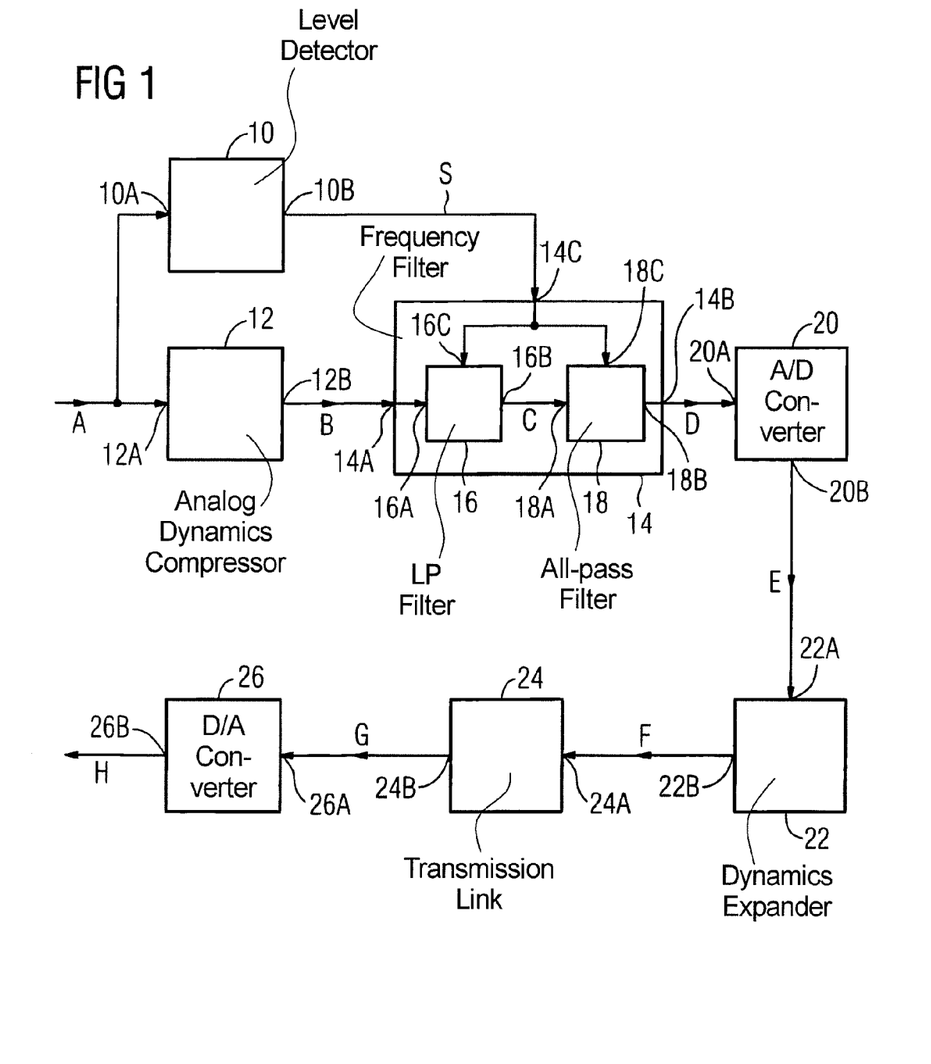
FIG. 1 is a block diagram of a first embodiment of an apparatus for transmission of signals constructed and operating in accordance with the invention.

FIG. 1 shows an apparatus for transmission of signals that is particularly suitable for MR signals. As is typical with MR signals, the input signals A to be transmitted and/or the transmitted input signals A exhibit a central lobe of maximal signal level and secondary lobes of lower signal level. An MR signal is stronger the greater the rotating, transverse component of the magnetization. The signal strength decreases when the magnetization aligns again along the field lines after the pulse and the transverse component disappears.

Due to the described curve of the pulses, MR signals exhibit a very high dynamic range of approximately 100 dB, but exhibit a relatively small monitoring bandwidth of approximately 500 kHz. For digitization of a signal with such a high dynamic range, an analog-digital converter 20 with comparably high bit width or discretization depth would be necessary, which is relatively expensive.

A reduction of the dynamic range of the input signals A, in particular MR signals, is therefore desirable. For this purpose, an analog dynamic compressor 12 is connected before the analog-digital converter 20. After digitization of the compressor signal B by the analog-digital converter 20, the signal is digitally expanded (for example with the aid of a dynamic expander 22 based on a lookup table) the original signal is regained. An analog-digital converter 20 with significantly less bandwidth or discretization depth thus can be used.

A suitable dynamic compressor 12 is described, for example, in DE 101 48 441 C1 and has a number of amplifier stages connected in series, each stage having an output amplification limited to a stage limit level, and a summation stage for summation of the output signals of the amplifier stages and of the input signal to be compressed. The summation signal is then the compressed signal. The compressor output signal B thus is $$B = K(A) \cdot A.$$

wherein A is the input signal of the dynamic compressor 12 according to FIG. 1 and K(A) is the degree of compression of the dynamic compressor 12, dependent of the course of the input signal A.

Figure 6:
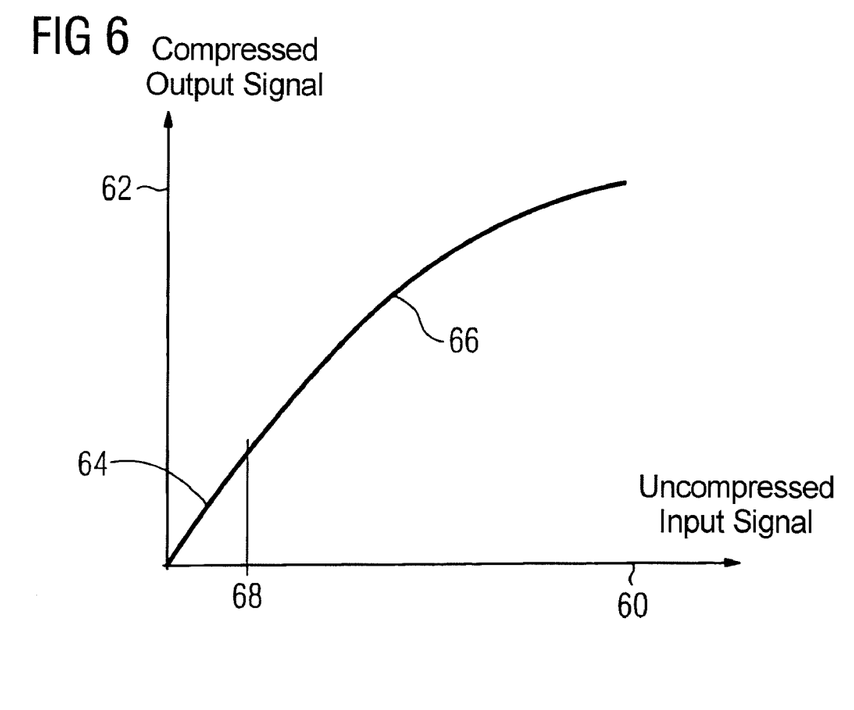
FIG. 6 shows the amplification characteristic of an ideal dynamic compressor.

To reduce the signal-to-noise ratio, compression first takes places from a specific level range, for example 60 dB under full excitation, but small signals still are linearly amplified. FIG. 6 shows an example of an amplification characteristic 66 of such an ideal dynamic compressor in double logarithmic representation. Below a minimal level 68 the uncompressed signal 60 is amplified according to a linear characteristic 64; above the minimal level 68, the amplification is performed by means of an exponential characteristic line 66 with an exponent smaller than 1 to produce a compressed output signal 62.

The described characteristic ensures that the analog-digital converter 20 is also sufficiently driven for given small signals. However, the more significantly compressed a signal is, the more strongly the uneven harmonics also develop since, for example, a sine signal, which is more and more significantly compressed will approximate a square wave signal.

In order to be able to reconstruct the original signal by expansion without errors, the analog input part of the analog-digital converter 20 must exhibit a large bandwidth, such that a sufficient number of harmonics are detected. A number of noise sidebands are thus also merged into the baseband, which distinctly degrades the original noise ratio of the purely analog system.

This is explained using an example. Given a baseband of 1 to 2 MHz and a clock frequency of 10 MHz, the 50th uneven harmonic should still be detected. Given an input signal of 2 MHz base frequency, the bandwidth thus extends to $$(2n-1) \cdot 2 \text{ MHz} = 99 \cdot 2 \text{ MHz} = 198 \text{ MHz}.$$

Every m·10 MHz (m=1 . . . 20), two 1 MHz-wide sidebands thus merge into the baseband, thus for example between 8 and 9 MHz, 11 and 12 MHz, 18 and 19 MHz, 21 and 22 MHz up to the band between 198 and 199 MHz. The effective noise bandwidth for a given still-uncompressed signal is thereby approximately 2·20=40 times greater than without analog-digital conversion. If the noise present at the analog-digital converter would be white up to a frequency of 200 MHz, the signal-to-noise ratio would thus be degraded by approximately 16 dB. This very high value shows that a distinct degradation of the signal-to-noise ratio to be recognized even given a realistic, noise power density exhibiting low-pass filter-like characteristic at the input of the analog-digital converter.

Figure 2:
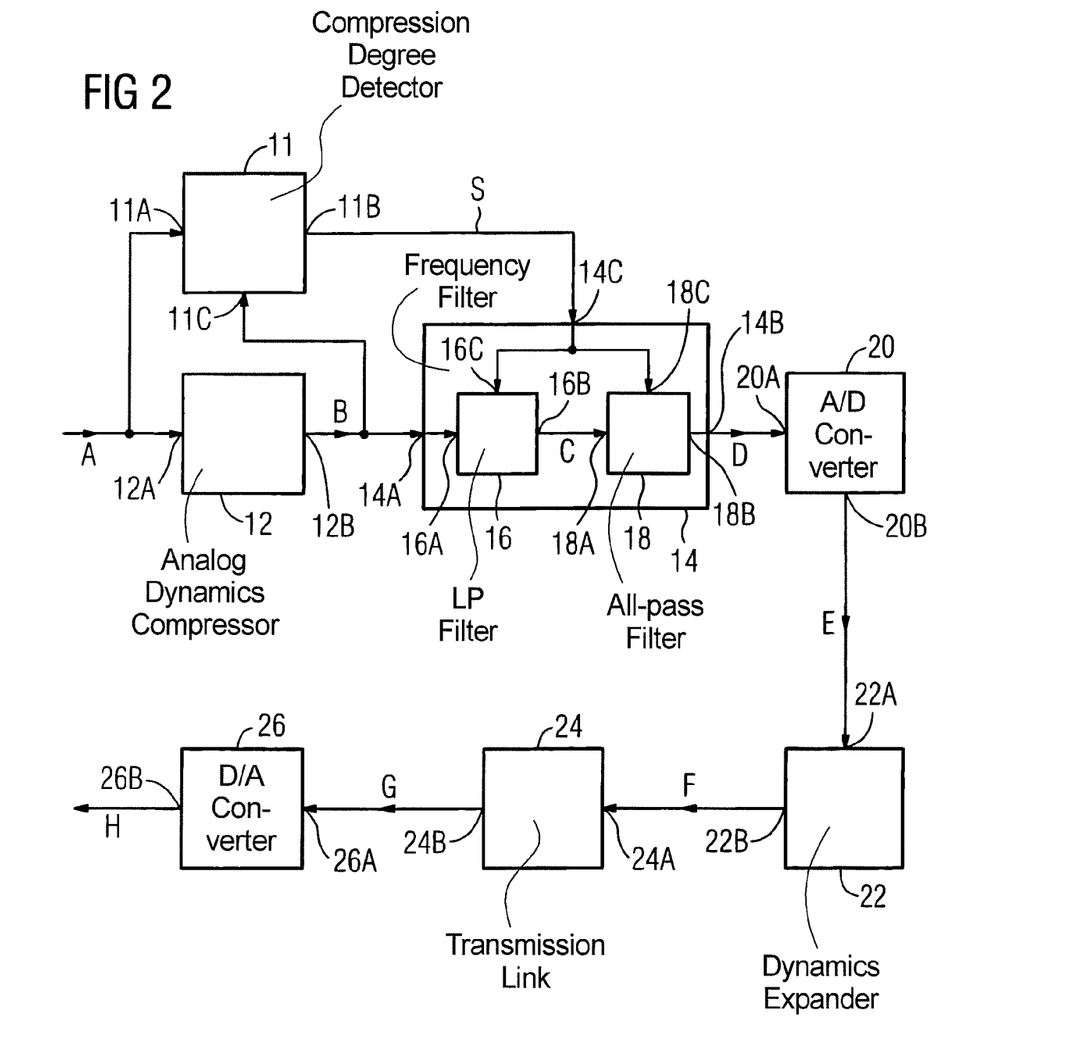
FIG. 2 is a block diagram of a second embodiment of an apparatus for transmission of signals constructed and operating in accordance with the invention.
Figure 7:
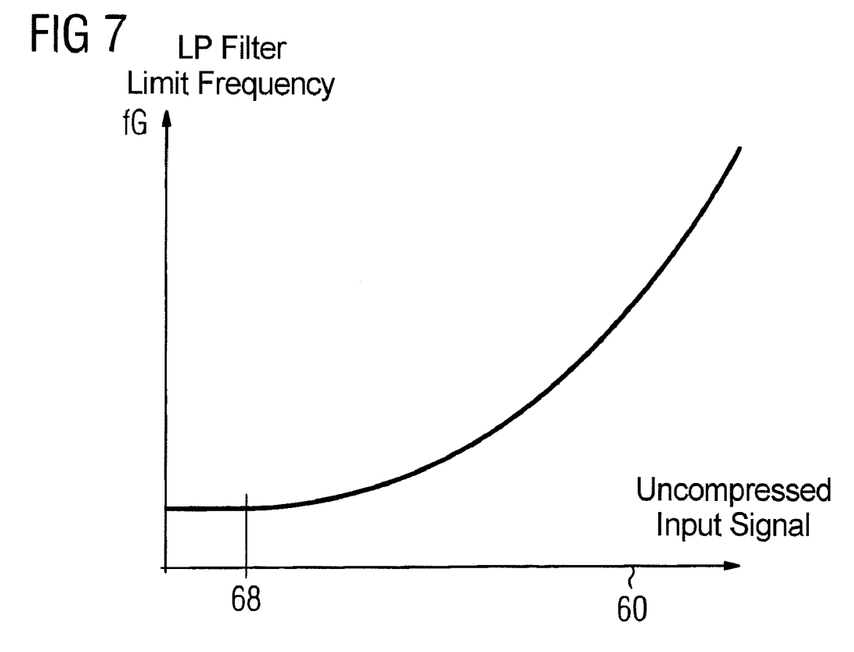
FIG. 7 shows the limit frequency of a controllable low-pass filter dependent on the level of the compressed input signal.

To improve the signal-to-noise ratio, in the exemplary embodiments according to FIG. 1 and FIG. 2 a low-pass filter 16 having a filter characteristic according to FIG. 7 is connected between the dynamic compressor output 12B and the analog-digital converter input 20A, the limit frequency fG of this low-pass filter 16 being controlled above the minimal level 68 dependent on the level of the uncompressed input signal 60, and thus on the degree of compression K(A). Since the degree of compression K(A) depends on the level of the input signal A of the dynamic compressor 12, it can be determined very simply by a level detector 10, for example a logarithmic amplifier IC of the type AD8307 available from Analog Devices.

In the exemplary embodiment according to FIG. 1, the input signal A is supplied to the compressor input 12A of the dynamic compressor 12 as well as the level detector input 10A of the level detector 10. The level detector 10 determines a control signal S for the controllable frequency filter 14 from the input signal A.

After the effected compression of the input signal A, the dynamic compressor 12 supplies the compressor output signal B to the frequency filter input 14A of the frequency filter 14 at the compressor output 12B. Additionally, at its frequency filter control signal input 14C, the frequency filter 14 receives the control signal S from the level detector output 10B of the level detector 10.

As the frequency filter 14 is controlled, it is to ensure that the group delays of the level detector 10 and the dynamic compressor 12 do not deviate significantly from one another, so that the change of the limit frequency is performed at the right point in time. If required, a fixed group delay filter (among other things one or more all-pass filters 18) is therefore connected at the input of the respective faster path. Similar considerations apply for the low-pass filter 16. Given a change of the limit frequency of a low-pass filter, its phase response or the group delay also changes. This is normally undesirable in the case of MR signals. For this purpose, a controllable, all-pass filter and a controllable low-pass filter are used. The group delay of the all-pass filter 19 is controlled such that the same group delay results independent of the limit frequency.

Within the frequency filter 14, the compressor output signal B is supplied from the frequency filter input 14A to the low-pass filter input 16A of the low-pass filter 16 and the control signal S is supplied from the frequency filter control signal input 14C to the low-pass control signal input 16C and the all-pass filter control signal input 18C. The low-pass filter output signal C arrives at the all-pass filter input 18A of the all-pass filter 18 from the low-pass filter output 16B of the low-pass filter 16. The all-pass filter output 18B of the all-pass filter 18 passes the frequency filter output signal D to the frequency filer output 14B of the frequency filter 14. This then arrives at the analog-digital converter input 20A of the analog-digital converter 20.

Figure 4:
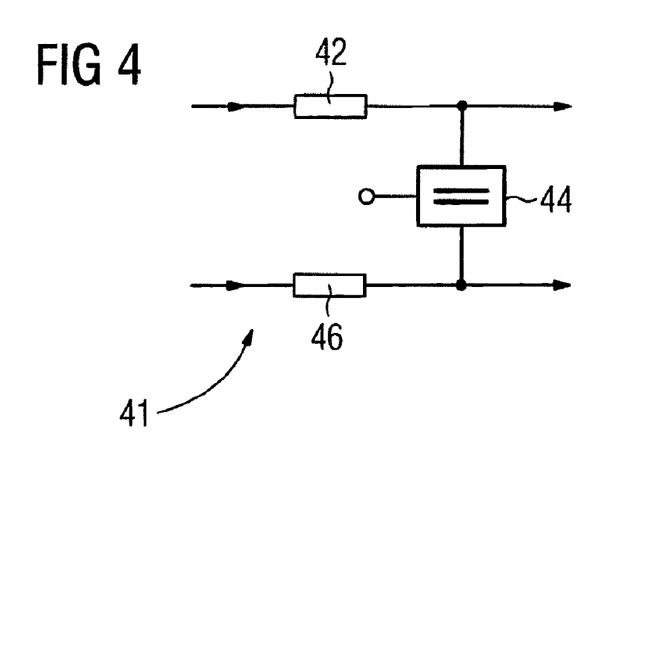
FIG. 4 is a block diagram of a controllable low-pass filter used in the inventive apparatus.
Figure 5:
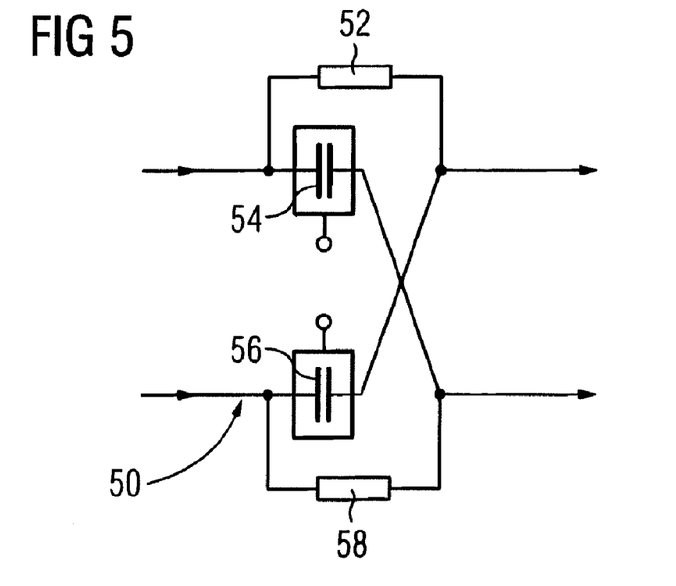
FIG. 5 is a block diagram of a controllable group delay filter in the form of an all-pass filter used in the inventive apparatus.

Controllable low-pass and all-pass filters for the frequency filter 14 can, for example, be realized by means of simple RC networks whose R and/or C portion is realized controllably (for example capacity diodes as controllable capacitors). FIG. 4 and FIG. 5 show examples.

The analog-digital converter output signal E is expanded again in the dynamic expander 22 after the digitization, such that the original dynamic is regained to the largest extent possible. The signal can subsequently be transmitted via wires or wirelessly and if necessary, can be reconverted back into the analog digital-analog converter output signal H by a digital-analog converter 26.

The analog-digital converter output signal E of the analog-digital converter output 20B is then linked with the dynamics expander input 22A of the dynamic expander 22 based on lookup tables. The expander output signal F is emitted at the expander output 22B. The expander output signal F is connected to the transmission link input 24A of a transmission link 24. The transmission link 24 relays the transmission link output signal G from its transmission link 24B to the digital-analog converter input 26A of a digital-analog converter 26.

This emits the now analog digital-analog converter signal H at its digital-analog converter output 26B.

FIG. 2 shows a further preferred embodiment in which, instead of a level detector, a compression degree detector 11 reads the compressor output signal B of the dynamic compressor 12 at the second compression degree detector input 11C in addition to the input signal A read at the first compression degree detector input 11A. The degree of compression and therewith the control signal S hereby result from the logarithmic ratio log (A/B) of the input signal A and of the compressor output signal B. The determination can be realized via an electric circuit with two analog logarithm detectors and an analog subtractor connected after them, since log (A/B)=log A−log B.

Figure 3:
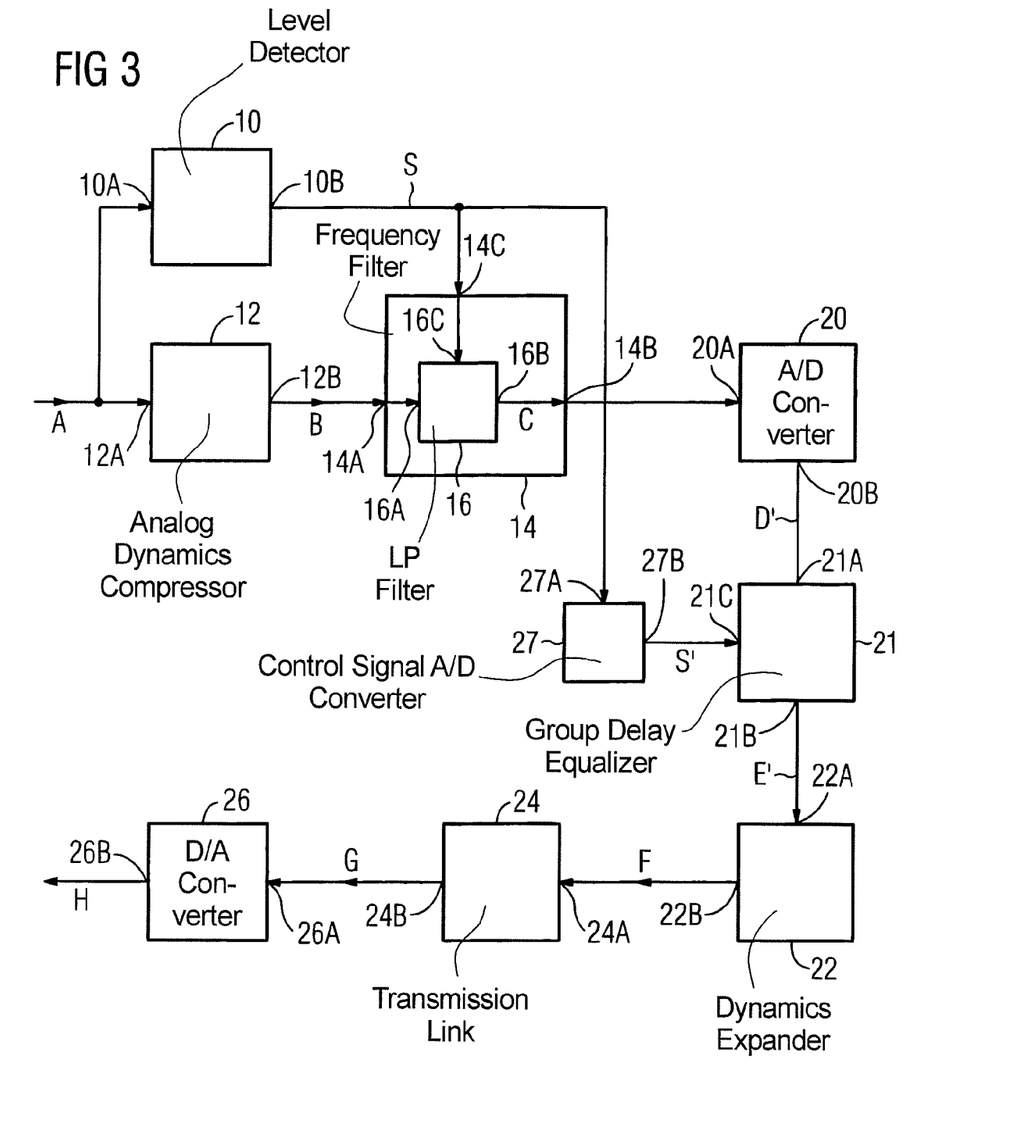
FIG. 3 is a block diagram of a third embodiment of an apparatus for transmission of signals constructed and operating in accordance with the invention.

FIG. 3 shows a further embodiment in which the controllable all-pass filter 18 is omitted relative to FIG. 1, whereby the low-pass filter output 16B of the low-pass filter 16 is directly connected with the analog-digital converter input 20A of the analog-digital converter 20. In the embodiment according to FIG. 3, the group delay equalizer input 21A of a digitally-controllable group delay equalizer 21 (at whose group delay equalizer control input 21C the control signal analog-digital converter output 27B of the control signal analog-digital converter 27 is connected via the digitized control signal S') is connected with the analog-digital converter output 20B of the analog-digital converter 20 via the group delay equalizer input signal D'.

The control signal analog-digital converter 27 reads the control signal S at the control signal analog-digital converter input 27A and converts into digital form only portions of the control signal S having a current level in the upper, compressed range of the dynamic compressor 12. Dependent on the digitized control signal S', the digital, controllable group delay equalizer 21 changes the delay of the digital group delay equalizer input signal D' such that the approximately identical group delay results independent of the limit frequency of the low-pass filter 16. In this embodiment, the group delay equalizer output 21B of the digital, controllable group delay equalizer 21 is connected via the group delay equalizer output signal E' with the dynamic expander input 22A of the dynamic expander 22.

FIG. 4 shows an example of a circuit for the low-pass filter 41, formed by a first low-pass filter resistor 42, a second low-pass resistor 46 and a controllable low-pass capacitor 44.

FIG. 5 shows a preferred embodiment for the all-pass filter 50 composed of a first all-pass resistor 52, a second all-pass resistor 58, a controllable first all-pass capacitor 54 and a controllable second all-pass capacitor 56.

In the exemplary embodiment according to FIG. 4 and FIG. 5, the controllable capacitors are realized in the form of controllable capacitance diodes in order to be able to change the limit frequency of the low-pass filter as well as the group delay of the all-pass filter.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for transmitting signals comprising:
   supplying an input signal, exhibiting dynamics, to a dynamic compressor and, in said dynamic compressor, compressing the dynamics of said input signal with a degree of compression, thereby producing a compressed signal;
   generating a control signal dependent on said degree of compression by detecting an amplitude level of said input signal and detecting said compressed signal directly from said dynamic compressor; and supplying said compressed signal from said dynamic compressor to a component separate from said dynamic compressor and limiting said compressed signal in said component dependent on said degree of compression represented in said control signal.

2. A method as claimed in claim 1 wherein the step of generating said control signal comprises generating said value as a point on a predetermined curve defining said relationship between said input signal and said compressed signal value.

3. A method as claimed in claim 1 wherein the step of limiting said compressed signal in said component comprises limiting a frequency bandwidth of said compressed signal substantially continuously dependent on said degree of compression.

4. A method as claimed in claim 1 wherein the step of limiting said compressed signal in said component comprises varying said compressed signal as a monotonic function over a predetermined range of said degree of compression, dependent on said degree of compression.

5. A method as claimed in claim 1 wherein the step of limiting said compressed signal in said component comprises modifying a frequency bandwidth of said compressed signal dependent on at least one predetermined limit value of said degree of compression.

6. A method as claimed in claim 1 wherein the step of limiting said compressed signal in said component comprises modifying a frequency bandwidth of said compressed signal in a frequency filter.

7. A method as claimed in claim 6 wherein the step of modifying said frequency bandwidth in said component comprises modifying said frequency bandwidth in a frequency filter disposed downstream from said dynamic compressor.

8. A method as claimed in claim 6 wherein the step of modifying said frequency bandwidth in a frequency filter comprises modifying said frequency bandwidth in a low-pass filter having a limit frequency and controlling said limit frequency of said low-pass filter dependent on said degree of compression.

9. A method as claimed in claim 1 wherein the step of limiting said compressed signal in said component comprises modifying a frequency bandwidth of the compressed signal dependent on said degree of compression, and maintaining a group characteristic of said compressed signal, selected from the group consisting of a group delay and a group phase, substantially constant or independently of said frequency bandwidth by a component selected from the group consisting of an all-pass filter, a group delay filter, a digital group delay filter, and a digital group delay equalizer.

10. A method as claimed in claim 1 wherein the step of limiting said compressed signal in said component comprises limiting a frequency bandwidth of said compressed signal in a low-pass filter having a limit frequency by compensating for a change of a group delay of said signal by changing said limit frequency with a further filter selected from the group consisting of all-pass filters and group delay filters.

11. A method as claimed in claim 1 wherein the step of limiting said compressed signal in said component comprises modifying a frequency bandwidth of said compressed signal in a frequency filter dependent on said degree of compression.

12. A method as claimed in claim 11 comprising generating said control signal to give said control signal and said compressed signal a substantially equal signal characteristic selected from the group consisting of phase and signal delay.

13. A method as claimed in claim 11 wherein said control signal and said compressed signal exhibit a phase shift relative to each other, and comprising compensating for said phase shift by bringing said control signal and said compressed signal substantially in-phase with each other.

14. A method as claimed in claim 1 wherein the step of limiting said compressed signal in said component dependent on said degree of compression comprises adjusting a frequency bandwidth of said compressed signal to dive said compressed signal has a larger frequency bandwidth for a given lower degree of compression.

15. A method as claimed in claim 1 wherein the step of limiting said compression signal in said component comprises adjusting a frequency bandwidth of said compression signal to a greater degree for a given greater degree of compression, and adjusting a signal-to-noise ratio of said signal to a lower degree for a given lower degree of compression.

16. A method as claimed in claim 2 comprising compressing said input signal in a dynamic compressor having a compression characteristic representing a logarithmic ratio of a level of said input signal to said dynamic compressor and an output signal of said dynamic compressor, and using said logarithmic ratio as said relationship to generate said value.

17. A method as claimed in claim 1 comprising selecting said input signal from the group consisting of electrical signals and optical signals.

18. A method as claimed in claim 1 comprising employing a magnetic resonance signal obtained from a magnetic resonance imaging system as said input signal to said dynamic compressor.

19. A method as claimed in claim 1 comprising supplying a signal, as said input signal, to said dynamic compressor having a frequency bandwidth in a range between 0.2 MHz and 1.5 MHz.

20. A method as claimed in claim 19 comprising supplying a signal, as said input signal, to said dynamic compressor having a frequency bandwidth in a range between 0.5 MHz and 1 MHz.

21. A method as claimed in claim 19 comprising supplying a signal, as said input signal, to said dynamic compressor having a frequency bandwidth of approximately 500 kHz.

22. A method as claimed in claim 1 comprising supplying a signal, as said input signal, to said dynamic compressor having a frequency bandwidth in a range between 0.1 MHz and 3 MHz.

23. A method as claimed in claim 1 comprising supplying a signal, as said input signal, to said dynamic compressor exhibiting dynamics in a range between 50 dB and 120 dB, and compressing said input signal to produce said compressed signal with dynamics in a range between 50 dB and 100 dB.

24. A method as claimed in claim 23 comprising supplying a signal, as said input signal, to said dynamic compressor having dynamics of approximately 100 dB, and compressing said input signal to produce said compressed signal with dynamics of approximately 80 dB.

25. A method as claimed in claim 1 comprising supplying a signal, as said input signal, to said dynamic compressor exhibiting a central lobe of maximum signal amplitude and secondary lobes of lower signal amplitudes.

26. A method as claimed in claim 1 comprising digitizing the compressed and limited signal in an analog-to-digital converter to produce a digital signal, and transmitting said digital signal, via a transmission link selected from the group consisting of hardwired transmission links and wireless transmission links, to a digital expander, and expanding said digital signal in said digital expander.

27. An apparatus for transmitting signals comprising:
a dynamic compressor supplied with an input signal, exhibiting dynamics, said dynamic compressor, compressing the dynamics of said input signal with a degree of compression, thereby producing a compressed signal;
a signal generator configured to generate a control signal dependent on said degree of compression, by detecting an amplitude level of said input signal and detecting said compressed signal directly from said dynamic compressor; and
a limiter circuit supplied with said compressed signal from said dynamic compressor and said control signal, said limiting circuit limiting said compressed signal dependent on said degree of compression.

28. An apparatus as claimed in claim 27 wherein said limiter circuit limits said compressed signal by varying said compressed signal as a monotonic function over a predetermined range of said degree of compression, dependent on said degree of compression.

29. An apparatus as claimed in claim 27 wherein limiter circuit comprises a frequency filter, and limits said compressed signal by limiting a frequency bandwidth of said compressed signal substantially continuously dependent on said degree of compression.

30. An apparatus as claimed in claim 27 wherein limiter circuit comprises a frequency filter, and limits said compressed signal by limiting a frequency bandwidth of said compressed signal substantially continuously dependent on said degree of compression.

31. An apparatus as claimed in claim 29 wherein said frequency filter comprises a low-pass filter having a limit frequency and wherein said control signal controls said limit frequency of said low-pass filter dependent on said degree of compression to modify said frequency bandwidth.

32. An apparatus as claimed in claim 29 wherein said limiter circuit limits said compressed signal by modifying a frequency bandwidth of the compressed signal dependent on said degree of compression while maintaining a group characteristic of said compressed signal, selected from the group consisting of a group delay and a group phase, substantially constant independently of said frequency bandwidth, using a component selected from the group consisting of an all-pass filter, a group delay filter, a digital group delay filter, and a digital group delay equalizer.

33. An apparatus as claimed in claim 29 wherein said frequency filter is a low-pass filter having a limit frequency and wherein said limiter circuit limits said compressed signal by compensating for a change of said group delay of a signal by changing said limit frequency with a further filter selected from the group consisting of all-pass filters and group delay filters.

34. An apparatus as claimed in claim 27 wherein said limiter circuit comprises a frequency filter and limits said compressed signal by modifying a frequency bandwidth of said compressed signal in said frequency filter dependent on said control signal.

35. An apparatus as claimed in claim 34 wherein said control signal generator is configured to generate said control signal so that said control signal and said compressed signal have a substantially equal signal characteristic selected from the group consisting of phase and signal delay.

36. An apparatus as claimed in claim 34 wherein said control signal and said compressed signal exhibit a phase shift relative to each other, and wherein said limiter circuit comprises an equalizer that compensates for said phase shift by bringing said control signal and said compressed signal substantially in-phase with each other.

37. An apparatus as claimed in claim 27 wherein said limiter circuit limits said compressed signal dependent on said degree of compression by adjusting a frequency bandwidth of said compressed signal so that said compressed signal has a larger frequency bandwidth for a given lower degree of compression.

38. An apparatus as claimed in claim 27 wherein said limiter circuit limits said compression signal by adjusting a frequency bandwidth of said compression signal to a greater degree for a given greater degree of compression, and adjusting a signal-to-noise ratio of said signal to a lower degree for a given lower degree of compression.

39. An apparatus as claimed in claim 27 wherein said limiter circuit limits said compressed signal dependent on an amplitude of said input signal preceding said dynamic compressor.

40. An apparatus as claimed in claim 27 wherein said dynamic compressor receives said input signal as a signal selected from the group consisting of electrical signals and optical signals.

41. An apparatus as claimed in claim 27 wherein said dynamic compressor receives said input signal as a magnetic resonance signal obtained from a magnetic resonance imaging system.

42. An apparatus as claimed in claim 27 wherein said dynamic compressor receives a signal, as said input signal, having a frequency bandwidth in a range between 0.2 MHz and 1.5 MHz.

43. An apparatus as claimed in claim 42 wherein said wherein said dynamic compressor receives a signal, as said input signal, having a frequency bandwidth in a range between 0.5 MHz and 1 MHz.

44. An apparatus as claimed in claim 42 wherein said dynamic compressor receives a signal, as said input signal, having a frequency bandwidth of approximately 500 kHz.

45. An apparatus as claimed in claim 27 wherein said dynamic compressor receives a signal, as said input signal, having a frequency bandwidth in a range between 0.1 MHz and 3 MHz.

46. An apparatus as claimed in claim 27 wherein said dynamic compressor receives a signal, as said input signal, exhibiting dynamics in a range between 50 dB and 120 dB, and compresses said input signal to produce said compressed signal with dynamics in a range between 50 dB and 100 dB.

47. An apparatus as claimed in claim 46 wherein said dynamic compressor receives a signal, as said input signal, having dynamics of approximately 100 dB, and compresses said input signal to produce said compressed signal with dynamics of approximately 80 dB.

48. An apparatus as claimed in claim 27 wherein said dynamic compressor receives a signal, as said input signal, exhibiting a central lobe of maximum signal amplitude and secondary lobes of lower signal amplitudes.

49. An apparatus as claimed in claim 27 comprising an analog-to-digital converter that digitizes the compressed and limited signal to produce a digital signal, and a transmission link selected from the group consisting of hardwired transmission links and wireless transmission links, and a digital expander connected to said transmission link that expands said digital signal.

50. An apparatus as claimed in claim 27 wherein said signal generator is configured to generate said control signal by generating said value as a point on a predetermined curve defining said relationship between said input signal and said compressor.

51. An apparatus as claimed in claim 50 wherein said dynamic compressor has a compression characteristic representing a logarithmic ratio of a level of said input signal to said dynamic compressor and an output signal of said dynamic compressor, and wherein said control signal generator is configured to use said logarithmic ratio as said predetermined relationship to generate said valve.

* * * * *